United States Patent
Wu et al.

(10) Patent No.: US 9,384,812 B2
(45) Date of Patent: Jul. 5, 2016

(54) THREE-PHASE GSHE-MTJ NON-VOLATILE FLIP-FLOP

(71) Applicant: QUALCOMM Incorporated, San Diego, CA (US)

(72) Inventors: Wenqing Wu, San Diego, CA (US); Kendrick Hoy Leong Yuen, San Diego, CA (US); Karim Arabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/498,336

(22) Filed: Sep. 26, 2014

(65) Prior Publication Data

US 2015/0213868 A1    Jul. 30, 2015

Related U.S. Application Data

(60) Provisional application No. 61/932,770, filed on Jan. 28, 2014.

(51) Int. Cl.
*G11C 11/18* (2006.01)
*G11C 11/16* (2006.01)
(Continued)

(52) U.S. Cl.
CPC .......... *G11C 11/1693* (2013.01); *G11C 11/155* (2013.01); *G11C 11/16* (2013.01); *G11C 11/1673* (2013.01); *G11C 11/1675* (2013.01); *G11C 11/18* (2013.01);
(Continued)

(58) Field of Classification Search
CPC ................................ G11C 11/16; G11C 11/18

USPC .................................. 365/154, 158, 170, 171
See application file for complete search history.

(56) References Cited

U.S. PATENT DOCUMENTS

| | | | | |
|---|---|---|---|---|
| 4,820,939 A | * | 4/1989 | Sowell | H03K 3/0372 327/141 |
| 2004/0187086 A1 | * | 9/2004 | Trivedi | H03K 3/35625 716/113 |

(Continued)

FOREIGN PATENT DOCUMENTS

WO    2012171989 A2    12/2012

OTHER PUBLICATIONS

Manipatruni et al., Energy-delay performance of giant spin Hall effect switching for dense magnetic memory, 2014, The Japan Sociiety of Applied Physics, pp. 103001-1 to 10300-4.*

(Continued)

*Primary Examiner* — Hoai V Ho
*Assistant Examiner* — Jay Radke
(74) *Attorney, Agent, or Firm* — Muncy, Geissler, Olds & Lowe, P.C.

(57) ABSTRACT

Systems and methods are directed to a three-phase non-volatile flip-flop (NVFF), which includes a master stage formed from a dual giant spin Hall effect (GSHE)-magnetic tunnel junction (MTJ) structure, with a first GSHE-MTJ and a second GSHE-MTJ coupled between a first combined terminal and a second combined terminal, and a slave stage formed from a first inverter cross-coupled with a second inverter. A first data value is read out from the slave stage during a read phase of the same clock cycle that a second data value is written into the master stage during a write phase. The three-phase NVFF includes three control signals, for controlling an initialization phase of the slave stage, the read phase, and the write phase.

26 Claims, 10 Drawing Sheets

(51) Int. Cl.
*H03K 3/356* (2006.01)
*H03K 3/3562* (2006.01)
*H03K 3/45* (2006.01)
*G11C 11/155* (2006.01)
*G11C 14/00* (2006.01)

(52) U.S. Cl.
CPC ....... *G11C 14/0081* (2013.01); *H03K 3/35625* (2013.01); *H03K 3/356008* (2013.01); *H03K 3/45* (2013.01)

(56) References Cited

U.S. PATENT DOCUMENTS

| | | | |
|---|---|---|---|
| 2010/0265760 | A1 | 10/2010 | Sakimura et al. |
| 2010/0271866 | A1* | 10/2010 | Sakimura et al. ............ 365/158 |
| 2013/0194862 | A1* | 8/2013 | Jung et al. .................... 365/158 |
| 2014/0056060 | A1* | 2/2014 | Khvalkovskiy et al. ...... 365/158 |
| 2014/0056061 | A1* | 2/2014 | Khvalkovskiy et al. ...... 365/158 |
| 2014/0169088 | A1* | 6/2014 | Buhrman et al. ............. 365/158 |
| 2014/0211552 | A1* | 7/2014 | PI et al. ........................ 365/158 |
| 2014/0264671 | A1* | 9/2014 | Chepulskyy et al. ......... 257/421 |
| 2014/0269032 | A1* | 9/2014 | Ong et al. ..................... 365/158 |
| 2014/0269035 | A1* | 9/2014 | Manipatruni et al. ........ 365/158 |
| 2014/0312441 | A1* | 10/2014 | Guo .............................. 257/427 |
| 2015/0036415 | A1* | 2/2015 | Di Pendina et al. .......... 365/148 |
| 2015/0041934 | A1* | 2/2015 | Khvalkovskiy et al. ...... 257/421 |
| 2015/0213869 | A1 | 7/2015 | Wu et al. |

OTHER PUBLICATIONS

Zhang et al., Giant Spin Hall Effect (GSHE) Logic Design for Low Power Application, 2015, EDAA, pp. 1000-1005.*
Gregory Pendina et al., "Hbyrid CMOS/Magnetic Process Design Kit and SOT-based Non-volatile Standard Cell Architectures", 2014 19th Asia and South Pacific Design Automation Converence (ASP-DAC), IEEE, Jan. 20, 2014, pp. 692-699.*
Jabeur K., et al., "Spin Orbit Torque Non-Volatile Flip-Flop for High Speed and Low Energy Applications," IEEE Electron Device Letters, Mar. 2014, vol. 35 (3), pp. 408-410.
Jabeur K., et al., "Study of Two Writing Schemes for a Magnetic Tunnel Junction Based on Spin Orbit Torque," International Journal of Electrical, Electronic Science and Engineering, World Academy of Science, Engineering and Technology, 2013, vol. 7 (8), pp. 1-6.
Kwon K.W., et al., "SHE-NVFF: Spin Hall Effect-Based Nonvolatile Flip-Flop for Power Gating Architecture," IEEE Electron Device Letters, Apr. 2014, vol. 35 (4), pp. 488-490.
Pai C-F., et al., "Spin transfer torque devices utilizing the giant spin Hall effect of tungsten," Applied Physics Letters, 2012, vol. 101 (12), pp. 1-18.
Zhao W., et al., "A non-volatile Flip-Flop in Magnetic FPGA chip," International Conference on Design and Test of Integrated Systems in Nanoscale Technology, 2006, pp. 323-326.
International Search Report and Written Opinion—PCT/US2015/011899—ISA/EPO—Apr. 14, 2015.
Pai C-F., et al., "Spin Transfer Torque Devices Utilizing the Giant Spin Hall Effect of Tungsten", Applied Physics Letters, American Institute of Physics, US, vol. 101, No. 12, Sep. 17, 2012, pp. 122404-122404, XP012164618, ISSN: 0003-6951, DOI: 10.1063/1.4753947 [retrieved on Sep. 18, 2012].

* cited by examiner

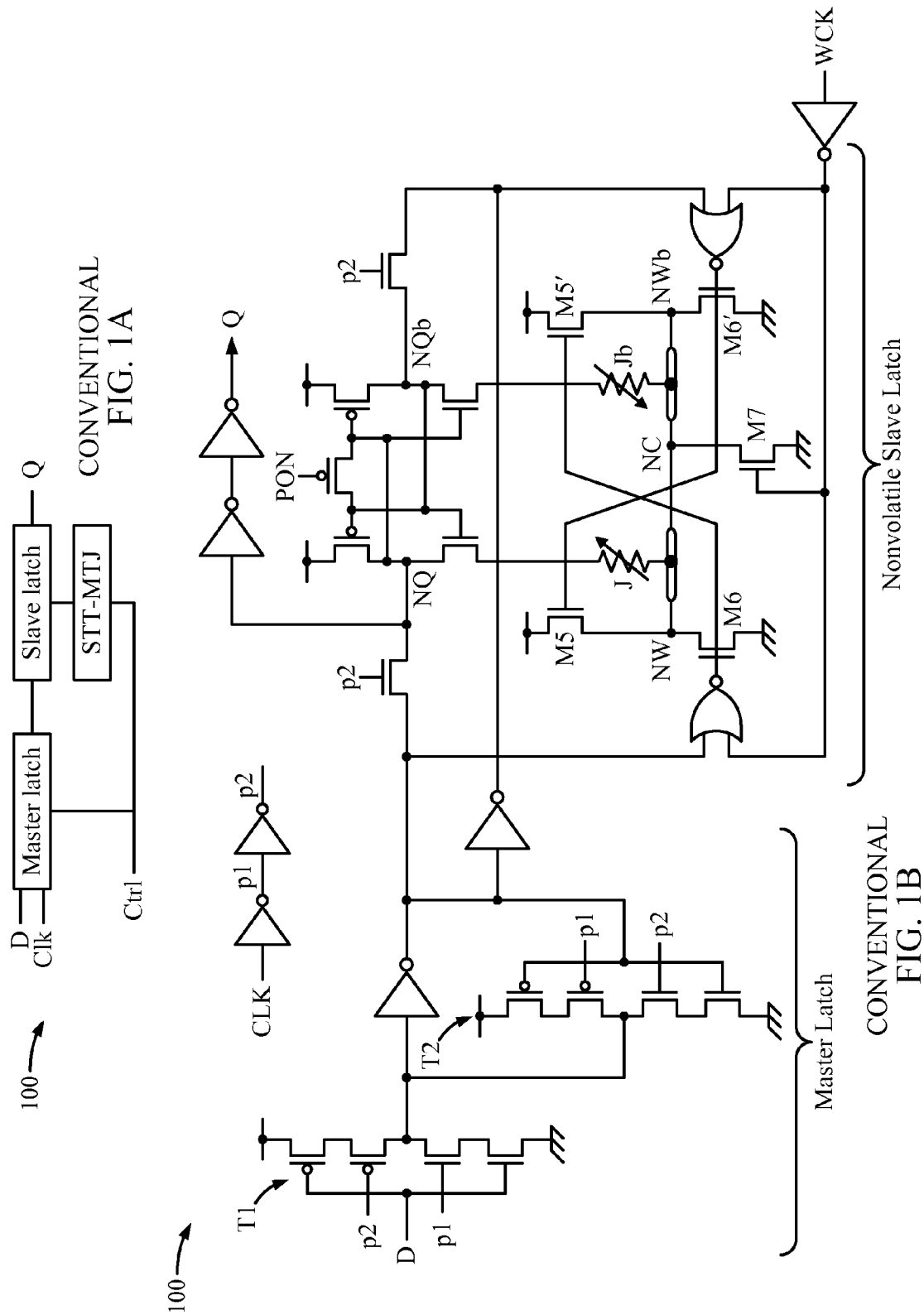
CONVENTIONAL
FIG. 1A
CONVENTIONAL
FIG. 1B

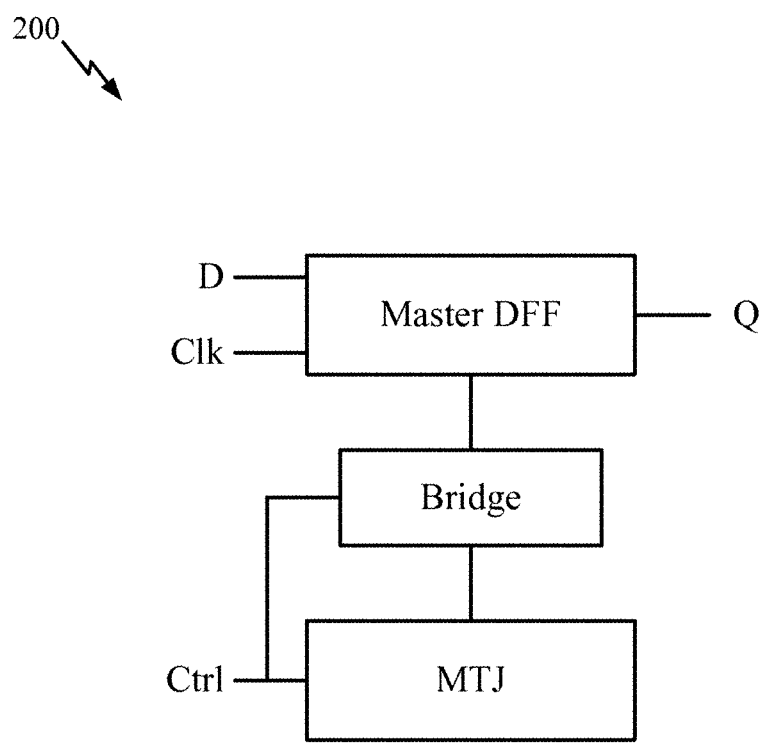
CONVENTIONAL
FIG. 2A

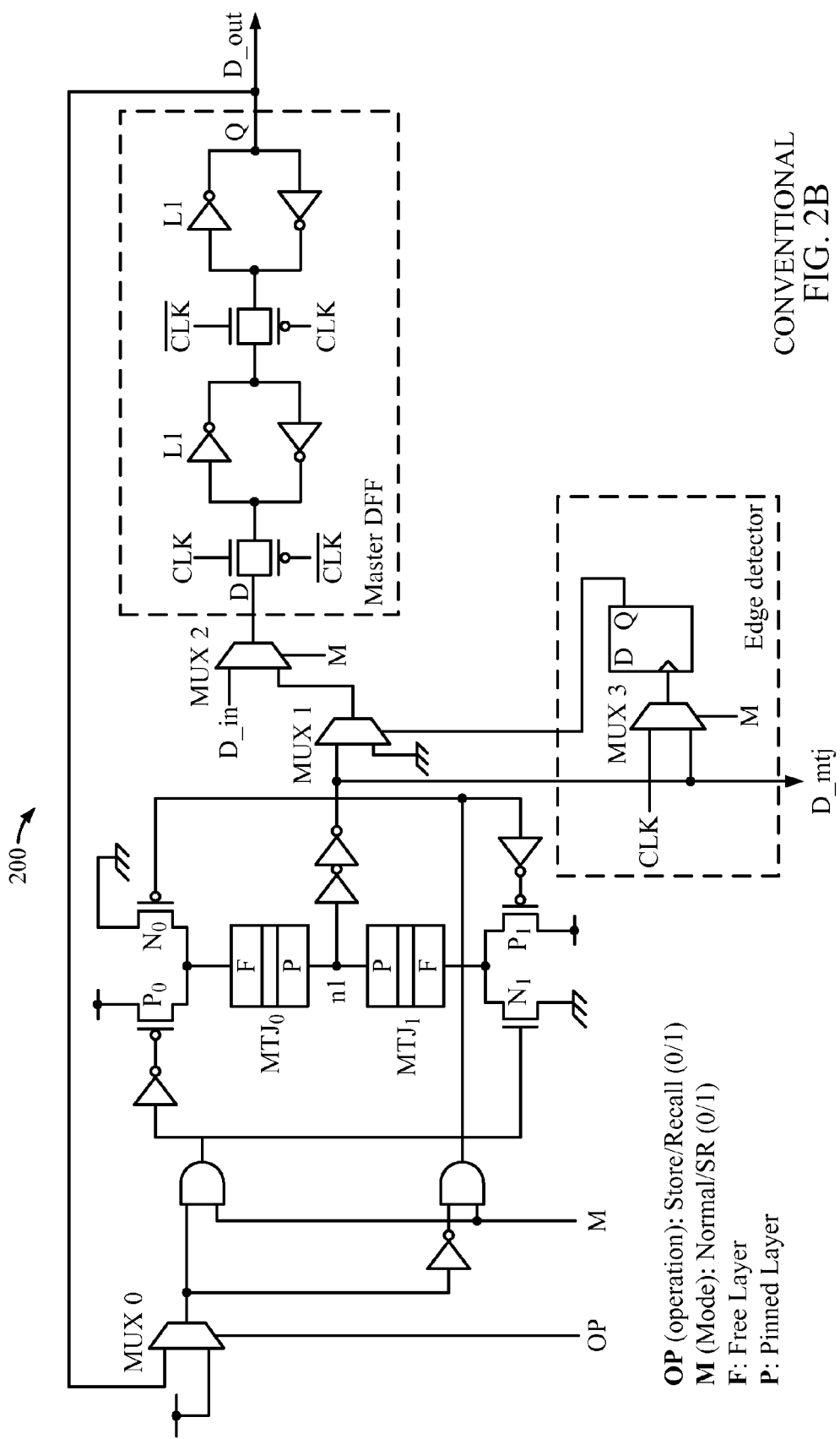
CONVENTIONAL
FIG. 2B

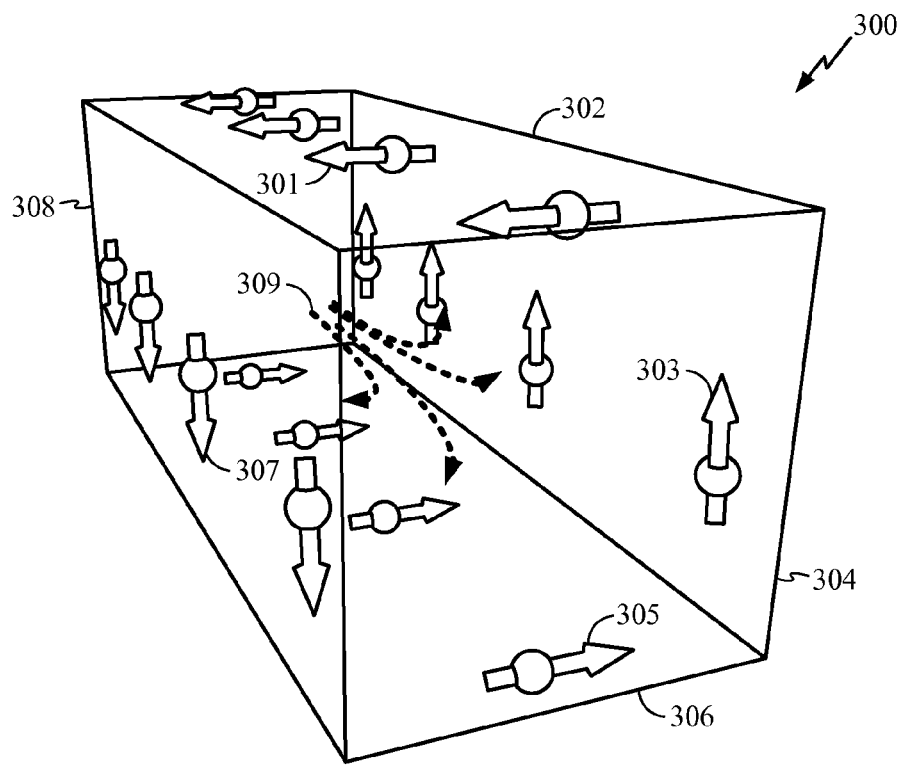
CONVENTIONAL
FIG. 3A
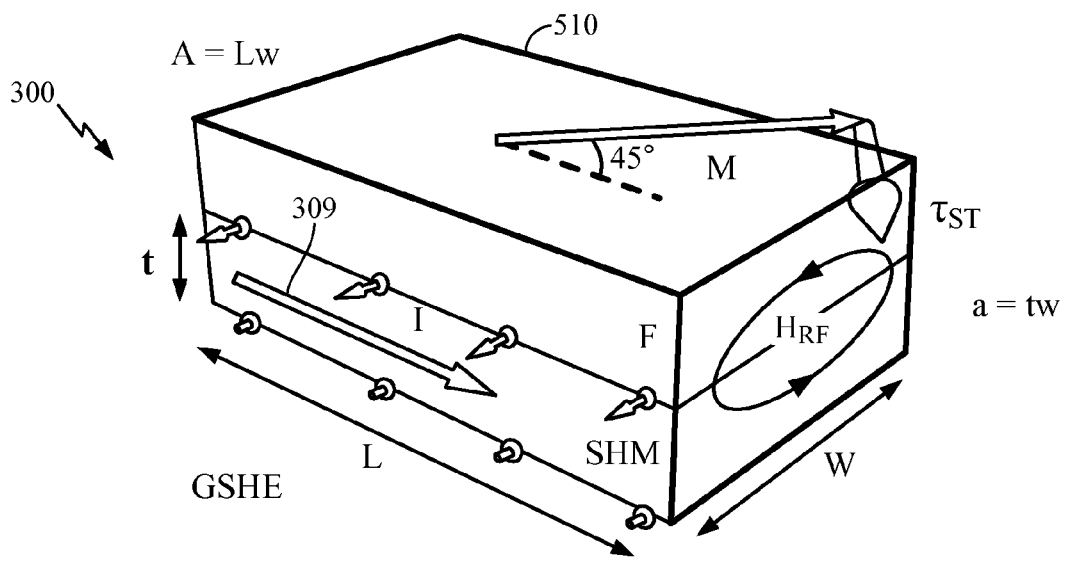
CONVENTIONAL
FIG. 3B

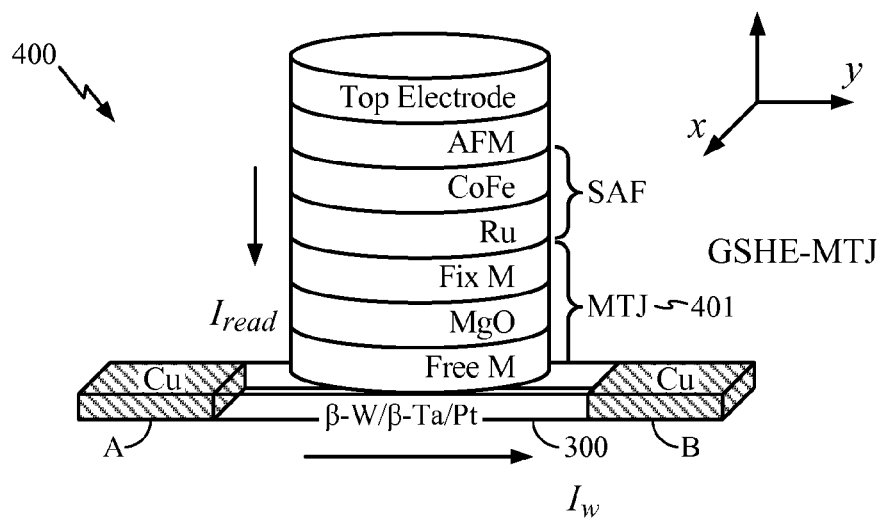
CONVENTIONAL
FIG. 4A
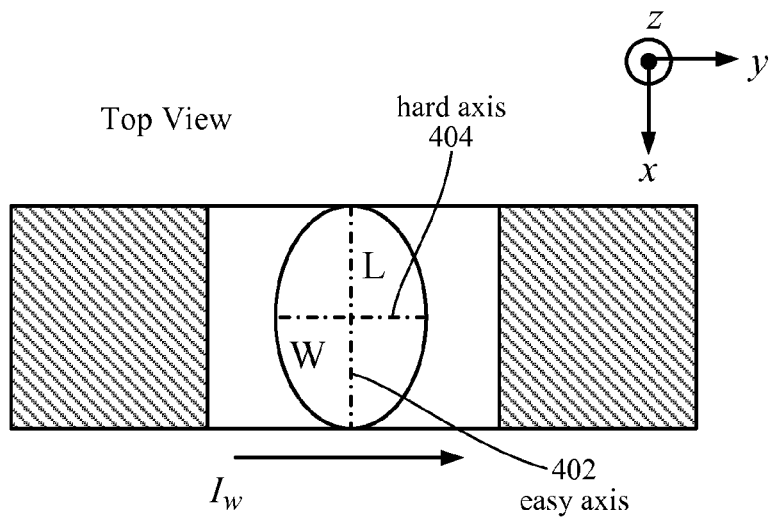
CONVENTIONAL
FIG. 4B
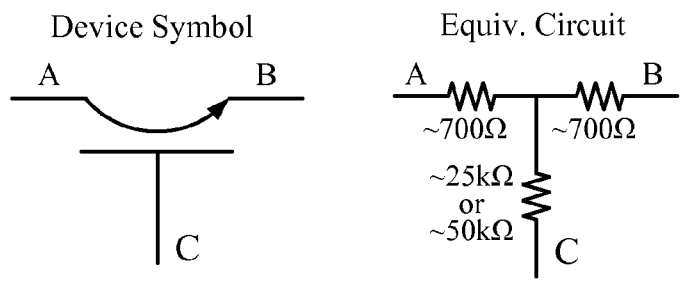
CONVENTIONAL
FIG. 4C

- Potential Energy
  - $\varepsilon = -0.5 H_K M_s \cos^2 \theta - H_x M_s \cos(\pi - \theta) - H_y M_s \cos(\pi/2 - \theta)$
- Critical Switching Conditioning
  1) $d\varepsilon/d\theta = 0$
  2) $d^2\varepsilon/d\theta^2 = 0$
- Solving these equations to reach switching threshold requirement:
  - ❖ $H_x^{2/3} + H_y^{2/3} = H_K^{2/3}$
  - ❖ a.k.a. Stoner-Wohlfarth Switching Astroid Stoner-Wohlfarth Switching Model Top View of GSHE-MTJ with only GSHE switching layer Top View of easy-axis tilted GSHE-MTJ with only GSHE switching layer

THREE-PHASE GSHE-MTJ NON-VOLATILE FLIP-FLOP

CLAIM OF PRIORITY UNDER 35 U.S.C. §119

The present application for patent claims the benefit of Provisional Patent Application No. 61/932,770 entitled "COMPACT LOW POWER 3 PHASE GSHE-MTJ NON-VOLATILE FLIP-FLOPS" filed Jan. 28, 2014, pending, and assigned to the assignee hereof and hereby expressly incorporated herein by reference in its entirety.

FIELD OF DISCLOSURE

Disclosed embodiments are directed to giant spin Hall effect (GSHE)-magnetic tunnel junction (MTJ) based non-volatile flip-flops, designed for low area and low power.

BACKGROUND

Flip-flops and latches are well-known non-volatile circuit elements commonly used in electronic integrated circuits. Flip-flops and latches may be used for data storage, or more specifically, storage of state in sequential logic. For example, in the hardware design of finite-state machines (FSMs), pipelined architecture, etc., an output and next state of a flip-flop/latch may be made to depend not only on its current input, but also on its current state (and thereby, on previous inputs). In this manner, sequential flow of control and data can be implemented. For example, with regard to a pipelined processor, flip-flops may be used for the traversal of data through one pipeline stage to the next, based on a corresponding clock signal. In this regard, it is required to be able to write data from a current pipeline stage to the flop-flops as the clock transitions to a next pipeline stage, while being able to read stored data in the flip-flops for the next pipeline stage.

Magnetoresistive Random Access Memory (MRAM) is a non-volatile memory technology that is finding popular applications in many state of the art electronic integrated circuit designs, particularly for its benefits in non-volatile memory systems. While flip-flops and latches based on MRAM technology exhibit several advantages over previously utilized semiconductor devices, the MRAM based flip-flops and latches are also limited in several aspects.

MRAM technology features response (read/write) times comparable to volatile memory, and in contrast to conventional RAM technologies which store data as electric charges or current flows, MRAM uses magnetic elements. The magnetic elements are typically known as magnetic tunnel junction storage elements or "MTJs," and are formed from two magnetic layers each of which can hold a magnetic field, separated by an insulating (tunnel barrier) layer. One of the two layers (fixed layer), is set to a particular polarity. The polarity of the other layer (free layer) is free to change to match that of an external field that can be applied. A change in the polarity of the free layer will change the resistance of the MTJ. For example, when the polarities are aligned, a low resistance state exists (parallel "P" magnetization low resistance state "0"). When the polarities are not aligned, a high resistance state exists (anti-parallel "AP" magnetization high resistance state "1"). The resistance inside any particular MTJ can be determined by measuring the electrical resistance, for example, by passing a current through the MTJ, and thus determining the resulting resistance state/logic value.

A modification from conventional MRAM is seen in spin transfer torque (STT)-MRAM, or STT-MTJ, where an STT-MTJ uses electrons that become spin-polarized as the electrons pass through a thin film (spin filter). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. Read/write circuitry related to an STT-MRAM bit cell (or STT-MTJ) formed in an STT-MRAM array, may include an access transistor coupled to the MTJ, bit lines, source lines, word lines, sense amplifiers, reference voltages, etc., as is known in the art.

In general, the design and construction of read/write circuitry related to the STT-MTJ requires that the same path be utilized for both reading and writing STT-MTJ bit cells, because, STT-MTJs are two-terminal devices. In other words, a separate path for reading an STT-MTJ and a separate path for writing the STT-MTJ are not available. This leads to advantages in terms of improved density of STT-MRAM arrays.

However, the two-terminal device configurations with the same read and write paths are not beneficial for the formation of flip-flops and latches using STT-MTJ bit cells. Since separate read and write paths do not exist, an STT-MTJ bit cell cannot be written while a read operation is being performed on the same STT-MTJ bit cell. Accordingly, it is not possible to construct a flip-flop directly from STT-MTJ bit cells. To achieve the functionality of a flip-flop using STT-MTJ bit cells, requires the construction of two latch stages, a master latch, and a slave latch, as are known in the art. STT-MTJ flip-flops constructed from two-stage latches utilize a large number of additional logic elements, and therefore, fail to harness the advantages of STT-MRAM technology.

For example, with reference to FIG. 1A, a schematic block diagram of a Master-Slave (MS) flip-flop 100 constructed using STT-MTJ bit cells is provided, along with a corresponding circuit diagram of flip-flop 100 in FIG. 1B. The illustrated MS latch design operates similar to a conventional set-reset (SR) latch design, and utilizes a current latch sense amplifier (CLSA). Briefly, with reference to FIG. 1A, the operation involves writing a D input to the master latch during a first clock phase, storing the value in the STT-MTJ and reading out the stored value from the slave latch during a second clock phase. With reference to FIG. 1B. The operation of flip-flop 100 involves storing a data value from the "D" input, as "Q" in the cross coupled latch formed using the MTJs labeled "J" and "Jb." The data value stored is read out from the "Q" output. In more detail, with continuing reference to FIG. 1B, signals "p1" and "p2" are derived from a system clock "CLK." The signals p1 and p2 drive the PMOS and NMOS transistors in transistor circuits T1 and T2 as shown, within the master latch. During a first phase of CLK, when p1 is high, input D is stored to the cross-coupled MTJ legs comprising the MTJs J and Jb. One of the terminals (source or drain) of the MTJs J and Jb is connected to a sense amplifier comprising cross-coupled inverters, with output nodes NQ and NQb. The node NQ is produces the output Q after being passed through additional drivers such as inverters. The other terminal (drain or source) of the MTJs J and Jb is connected to each other at node NC and to output nodes NW and NWb0 of cross-coupled inverters comprising transistors M5, M5', M6, M6' and M7. The data value stored can be read out from the slave latch from the NQ output (connected to Q) by activating the sense amplifier through the pass transistors coupled to the signal p2 when p2 is high.

Thus, the above design of flip-flop 100 requires a sense amplifier, and equalization of the two MTJ legs comprising MTJs J and Jb. Flip-flop 100 avoids multiple clocks by deriving signals p1 and p2 from the same clock, such that clock routing complexity and overhead are reduced. However, flip-flop 100 suffers from problems in writing to the MTJ cells in the slave latch during a read operation. This is because the sense amplifier needs to be activated for a read operation, which requires bit lines connected to the MTJ legs to be active. On the other hand, the bit lines connected to the MTJ legs need to be floated during a write operation, which provides for conflicting requirements. Therefore, this conventional design for flip-flop 100 is not suitable for forming efficient flip-flops.

With reference to FIGS. 2A-B, another non-volatile flip-flop design based on STT-MTJ cells is illustrated for flip-flop 200. FIG. 2A illustrates a circuit schematic of flip-flop 200 comprising a bridge between a master D-flip-flop (DFF) and a MTJ slave structure. The details of flip-flop 200 are explained further with reference to FIG. 2B which illustrates a detailed circuit diagram. Flip-flop 200 utilizes a voltage divider, rather than the CLSA arrangement of flip-flop 100 above. More specifically, at node n1, a midpoint voltage is derived when MTJ0 and MTJ1 are programmed as follows. When MTJ0 is in a high resistance state (logic "1") and MTJ1 is in a low resistance state (logic "0"), then the voltage at node n1 is logic "0". On the other hand, for the opposite combination stored, i.e., MTJ0 in low resistance state (logic "0") and MTJ1 in high resistance state (logic "1"), midpoint voltage VDD/2 appears at node n1. This midpoint voltage at node n1 is used to control the value D_in input to master DFF, which eventually appears as the node Q, as output D_out. Further detailed operation of flip-flop 200 will be understood by persons skilled in the art. For the sake of this disclosure, it will be recognized that the two MTJs, MTJ0 and MTJ1 cannot be read and written at the same time, and therefore, the additional latches L1 and L2 are required at the master DFF circuit. Since the MTJs are themselves storage devices, the use of additional metal oxide semiconductor (MOS) transistor based storage devices in the master DFF, for example, leads to undesired overhead. Further, flip-flop 200 also requires a two-level latch arrangement, since the MTJs cannot be written during a read operation. For the sake of low power and low cost, it is desirable to have a single stage operation which avoids the complexities and drawbacks of flip-flops 100 and 200 above.

SUMMARY

Exemplary embodiments include systems and methods directed to a three-phase non-volatile flip-flop (NVFF) formed from a dual giant spin Hall effect (GSHE)-magnetic tunnel junction (MTJ) structure.

For example, an exemplary aspect is directed to a three-phase non-volatile flip-flop (NVFF) comprising a master stage comprising a dual giant spin Hall effect (GSHE)-magnetic tunnel junction (MTJ) structure, the dual GSHE-MTJ structure comprising a first GSHE-MTJ and a second GSHE-MTJ coupled between a first combined terminal and a second combined terminal, and a slave stage comprising a first inverter cross-coupled with a second inverter. The slave stage is configured to be read out with a first data value during a first clock cycle of a clock, and the master stage is configured to be written with a second data value during the first clock cycle.

Another exemplary aspect is directed to a method of operating a three-phase non-volatile flip-flop (NVFF), the method comprising reading a first data value from a slave stage during a first clock cycle of a clock, the slave stage comprising a first inverter cross-coupled with a second inverter, and writing a second data value into a master stage during the first clock cycle, the master stage comprising a dual giant spin Hall effect (GSHE)-magnetic tunnel junction (MTJ) structure formed by coupling a first GSHE-MTJ and a second GSHE-MTJ between a first combined terminal and a second combined terminal of the dual GSHE-MTJ structure.

Yet another exemplary embodiment is directed to a system comprising, a three-phase non-volatile flip-flop (NVFF) with a master stage and a slave stage, means for reading a first data value from the slave stage during a first clock cycle of a clock, the slave stage comprising a first inverter cross-coupled with a second inverter, and means for writing a second data value into the master stage during the first clock cycle, the master stage comprising a dual giant spin Hall effect (GSHE)-magnetic tunnel junction (MTJ) structure formed by coupling a first GSHE-MTJ and a second GSHE-MTJ between a first combined terminal and a second combined terminal of the dual GSHE-MTJ structure.

BRIEF DESCRIPTION OF THE DRAWINGS

The accompanying drawings are presented to aid in the description of embodiments of the invention and are provided solely for illustration of the embodiments and not limitation thereof.

FIGS. 1A and 1B are illustrations of a conventional STT-MTJ based master-slave flip-flop.

FIGS. 2A and 2B are illustrations of another conventional STT-MTJ based flip-flop using a voltage divider.

FIGS. 3A-B illustrate a conductor displaying SHE and use of GSHE in magnetic switching.

FIG. 4A illustrates a side view of memory cell 400 formed by exploiting the SHE.

FIG. 4B is a top view of memory cell 400 of FIG. 4A.

FIG. 4C illustrates a device symbol and an equivalent circuit of memory cell 400 of FIG. 4A.

DETAILED DESCRIPTION

Figure 5A:
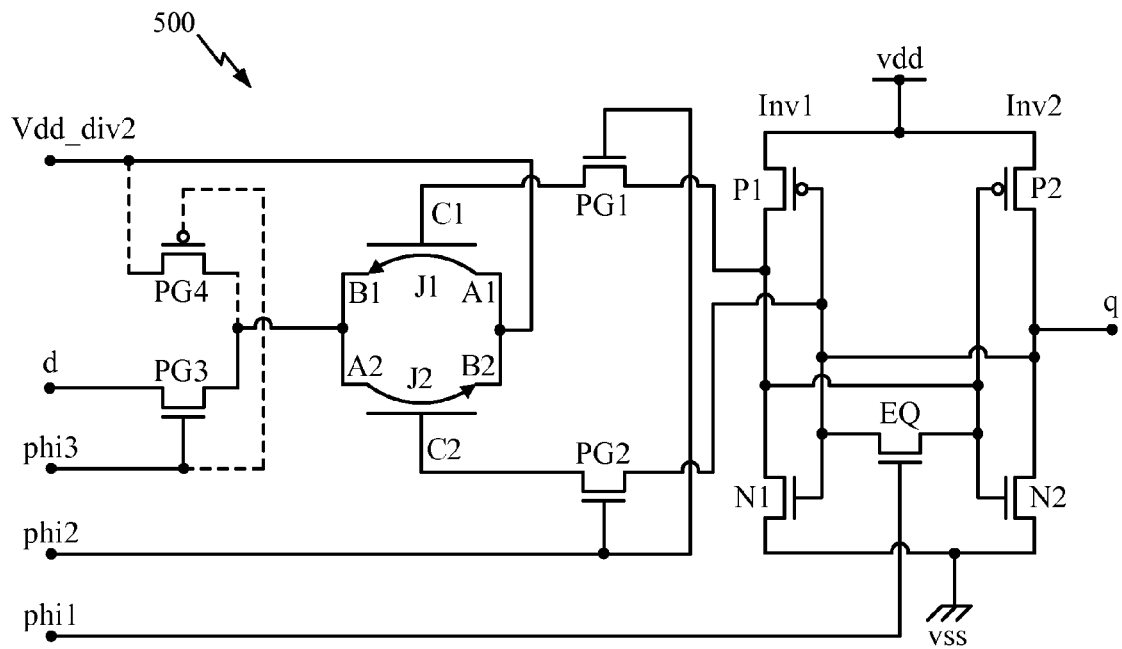
FIG. 5A illustrates a circuit diagram of an exemplary three-phase NVFF using dual GSHE-MTJ storage elements for a master stage.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

While the above-discussed STT-MRAM technology offers significant improvements over conventional SRAM technology for non-volatile memory cells, for example, in terms of size, speed, cost, area, etc., STT-MRAM technology has not been utilized efficiently in the design of non-volatile flip-flops and latches in conventional implementations. The two-terminal nature of STT-MRAM bit cells imposes limitations discussed above, with regard to writing the STT-MRAM bit cells during a read operation, as required for flip-flop functionality. Accordingly, exemplary embodiments are directed to overcoming these limitations with the use of three-terminal magnetic storage elements utilizing the so-called spin Hall effect (SHE) as follows.

With reference to FIG. 3A, SHE is demonstrated in conductor 300. Electrons 309 passing through conductor 300 in the direction indicated, get polarized on the surfaces 302, 304, 306, and 308 along the directions indicated by arrows 301, 303, 305, and 307 respectively due to spin-orbit coupling. A spin Hall ratio is defined as $$\theta_{SH} = \frac{J_S/(hh/2)}{IC/s}.$$

While SHE can be used to induce magnetic polarity along the directions 301, 303, 305, and 307, the effect can be improved by using special material (such as beta-tungsten) with appropriate thickness (such as thickness of just a few nanometers) for conductor 300, for example, as described in Pai et al. published as "Spin transfer torque devices utilizing the giant spin Hall effect of tungsten," Applied Physics Letters, §101, 122404, 2012 (hereinafter, the Pai reference). In more detail FIG. 3B illustrates conductor 300 with length (L),
thickness (t) and width (W), wherein, with reference to Pai, an improvement $\theta_{SH}$ is shown in orders of magnitude, up to ~0.33 times. This leads to a so-called giant spin Hall effect (GHSE).

The spin current generation efficiency is provided by the following equation:

$$\frac{I_S}{I_C} = \frac{I_S A}{I_C a} = \theta_{SH} \frac{A}{a} = \theta_{SH} \frac{L}{t},$$

where "$I_S$" is the spin current a "$I_C$" is the charge current. The spin current generation efficiency $I_S/I_C$ can be further boosted by making appropriate changes to dimensions of conductor 500. For example, for a value of $\theta_{SH}$=0.30, L=50-100 nm, and t=2 nm, it is seen that the ratio $I_S/I_C$ can be as high as 7.5-15. This spin current generation efficiency in the order of ~7.5-15, can be typical, considering that the ratio of L/t is ~25-50, is typical for cases where the thickness "t" is only a few nanometers whereas the length "L" is in the order of tens of nanometers. In comparison, the spin current generation efficiency from STT polarization is merely ~0.6.

Further, the $\theta_{SH}$ has improved over three orders of magnitude (~1000×) to ~0.3 for conductor materials such as beta-tungsten, beta-tantalum, and platinum, etc. These improvements relate to reasons why GSHE is considered to be "giant" in comparison to previously demonstrated SHE. The GSHE provides an efficient method to convert electric current based on electrons 309 into spin current, which can be used for providing switching current to MTJ cells.

Moreover, in comparison to STT-MRAMs, with the same resistance of the MTJ, the programming power using the GHSE effect can be approximately 50-200 times lower, which means that it is easier to write MTJs based on GHSE, which in turn, translates into smaller memory cells and high memory density. Moreover, a cap for the write current ($I_{write}$) observed for STT-MRAM (in order to avoid breakdown of the tunnel or barrier layer) is eliminated using GHSE. As shown, a magnetic element 310 placed on top of conductor 300 can get polarized in the direction indicated by arrow 301. As previously described, the ratio $I_S/I_C$ can be varied by adjusting area A (=L*w) or area a (=t*w), or in other words, by adjusting the ratio, L/t. If magnetic material 310 is placed in the orientation shown, where width W is wider than thickness t, the direction 301 influences the polarization of magnetic material 310. More specifically, when magnetic material 310, configured as a free layer, is placed on top of conductor 300, configured as a spin-orbital coupling layer, the spin orientation 301 from spin Hall effect can influence the magnetization of the free layer magnetic material 310.

With reference now to FIG. 4A, a side view of a conventional memory element 400 that is switched (programmed, or written) by SHE (or more specifically GSHE) is illustrated. A SHE/GSHE strip comprising conductor 400 (referred to simply as a GSHE strip 400 in this case), which may be formed from strong spin-orbit coupling material, such as β-W, β-Ta, or Pt is formed between terminals A and B. Terminals A and B may be formed from metals such as copper. An MTJ 401 is placed above the GSHE strip 300, with a free layer of MTJ 401 adjacent to and in contact with GSHE 400. Write current $I_w$ is passed through the GSHE strip in the direction indicated between A and B. Based on the induced spin polarization, the free layer of MTJ 401 can be switched. This provides an efficient way of programming MTJ 401 Additionally, in memory element 400, optional layers Ru, and CoFe, and an antiferromagnetic layer (AFM), and/or a synthetic antiferromagnetic layer (SAF) along with a top electrode are also depicted as formed on MTJ 401. MTJ 401 is read based on sensing the read current $I_{read}$, as will be further explained in following sections.

With reference to FIG. 4B, a top view of MTJ 401 switched by a conventional SHE/GSHE arrangement of FIG. 4A is shown. The direction 402 is perpendicular to the write current from/to terminal A to/from terminal B, and is referred to as the easy axis of MTJ 401. The free layer of MTJ 401 resides at a minimal magneto-static energy region along easy axis 402. In more detail, easy axis orientation is a property of the free layer based on the shape of the free layer. The free layer will always be magnetized along the easy axis when external magnetization force is removed. In conventional SHE switched MTJ, the SHE write current is orthogonal to the easy axis orientation such that the SHE induced spin orientation is in line with easy axis orientation. Thus, easy axis 402 is considered to be oriented along the x direction in FIG. 4B, and is transverse to the direction of write current $I_w$. On the other hand, hard axis 404 of MTJ 401, which is perpendicular to easy axis 402, is formed along the y direction. The free layer of MTJ 401 interfaces GSHE strip 300 and easy axis 402 is in line with or parallel to the corresponding GSHE induced spin orientation. In other words, the orientation of easy axis 402 of the free layer of MTJ 401 is parallel to the magnetization axis created by electrons traversing GSHE strip 300 between the two terminals A and B. As explained previously, the MTJ is in a low resistance state (P state) if the magnetization of the free layer is aligned (parallel) to the magnetization of the fixed layer; and the MTJ is in a high resistance state (AP state) if the magnetization of the free layer is anti-aligned (anti-parallel) to magnetization of the fixed layer.

With reference to FIG. 4C, an equivalent circuit of conventional SHE/GSHE switched MTJ element 400 is depicted, along with the symbol for the device. Under operational conditions, when the current between terminals A and B is no less than a threshold (~20 uA), the MTJ switches to state '0' (low MTJ resistance) if current flows from A to B; and to state '1' (high MTJ resistance) if the current flows in the opposite direction, from B to A. When the current between A and B is less than the threshold (~20 uA), the MTJ retains its previous state (either '0' or '1').

Figure 5B:
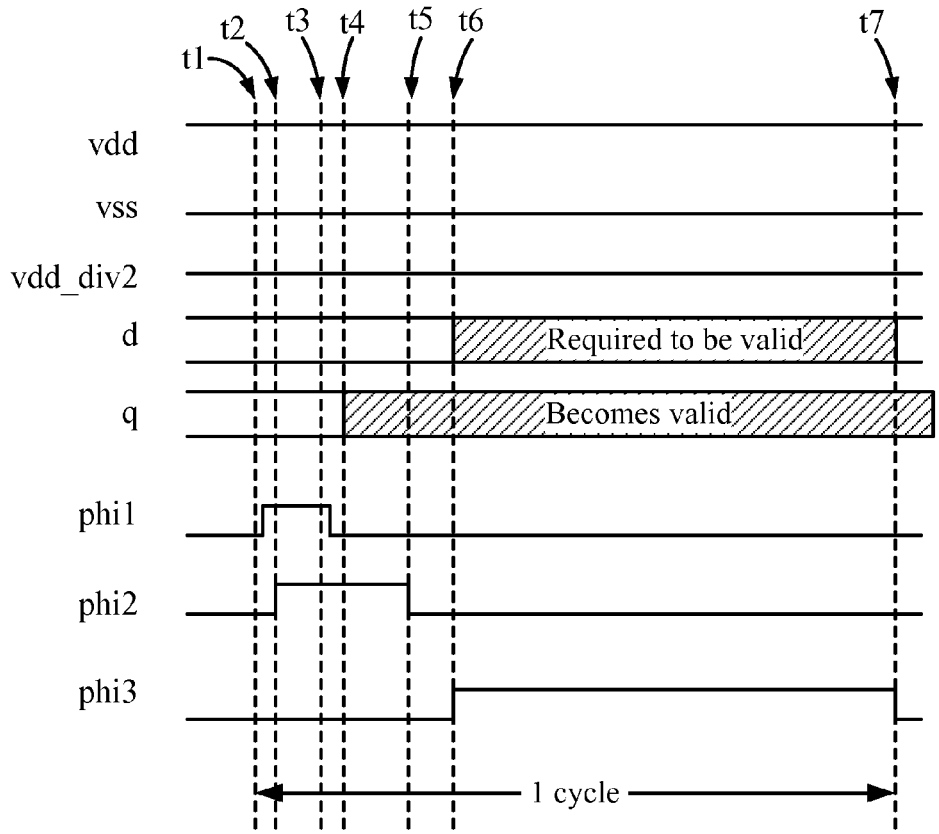
FIG. 5B illustrates a timing diagram related to the exemplary three-phase NVFF of FIG. 5A.

With reference to FIGS. 5A-B an exemplary non-volatile flip-flop (NVFF) 500 constructed from GSHE-MTJ elements, such as memory element 400, will be described. Improvements and/or modifications of NVFF 500 will be discussed in following sections. Accordingly, referring to FIG. 5A, NVFF 500 includes GSHE-STT-MTJ elements J1 and J2, which may be correspond to memory element 400. In one aspect, a master stage is formed using GSHE-MTJ devices J1 and J2 and a slave stage includes a pair of cross-coupled inverters. During operation, it may be possible to read out a first data value "q" from the slave stage in the same clock cycle that a second data value "d" is written into the master stage. The read and write operations can take place in multiple phases. During a first clock cycle, for example, in a first phase or initialization phase, the slave stage may be initialized, following which, in a second phase or read phase, the first data value which is currently stored in the master stage can be read out and becomes valid at the "q" output of NVFF 500. In a third phase or write phase, which follows, and is non-overlapping with, the second phase, a second data value "d" is written into the master stage.

In more detail, with reference to FIG. 5A, the master stage of NVFF 500 includes the two GSHE-MTJ devices J1 and J2, wherein, first and second terminals A and B of the two GSHE-MTJ devices J1 and J2 are electrically connected. The first terminal A1 of J1 is connected to second terminal B2 of J2 to form a first combined terminal A1B2, and second terminal B1 of J1 is connected to first terminal A2 of J2 to form a second combined terminal A2B1. These electrical connections may be enabled by physical stacking structures of MTJs on either side, or first and second sides, of a GSHE strip between the two terminals A1B2 and A2B1, which will be further described in the following sections.

The slave stage of NVFF 500 includes a pair of cross coupled inverters formed from conventional complementary metal-oxide semiconductor (CMOS) technology, with a first inverter (Inv1) formed from p-channel MOS (PMOS) pull-up transistors P1 and a n-channel MOS (NMOS) pull-down transistors N1. Similarly, a second inverter (Inv2) includes PMOS P2 and NMOS N2. The first and second inverters can be equalized using an equalization transistor EQ.

First control signal phi1, second control signal phi2, and third control signal phi3 control the above three phases for read and write operations on NVFF 500. The control signals phi1, phi2, and phi3 may be connected to individual ports or clock ports such as a first, second, and a third clock port of NVFF 500 in some aspects. The control signals phi1, phi2, and phi3 may be derived from a single clock, such as a system clock.

The first control signal phi1 is connected to the equalization transistor EQ, such that when phi1 is high, the two inverters Inv1 and Inv2 of the slave stage are equalized. More specifically, an input node of the first is coupled to an input node of the second inverter through the equalization transistor, such that when the equalization transistor is activated, the input nodes of the first and second transistor are connected and no valid output "q" is made available when phi1 is high. Thus, in order to obtain a valid output "q" from an output node of the second inverter, for example, it is necessary that phi1 is driven low. Thus, a short duration pulse is applied to equalize the inverters and then to return phi1 to a low stage, in order to initialize the slave stage for a read operation.

The second control signal phi2 is connected to first and second pass gate transistors PG1 and PG2. First read terminal C1 of first GSHE-MTJ J1, is connected to an output node of Inv1 through PG1, and second read terminal C2 of second GSHE-MTJ J2 is connected to an input node of Inv1 through PG2. The values read out from C1 and C2 will be complementary values. When phi2 is high, these complementary values are transferred to the nodes of Inv1 by turning on PG1 and PG2. When EQ is not enabled, the complementary values will be magnified or amplified by the cross-coupled inverters Inv1 and Inv2 to supply the data value at output node "q" derived on inverter Inv2. Thus, once phi1 is driven low, a high value is driven or maintained on phi2 to enable the transfer of data from the master stage to the slave stage with output "q." The output "q" may provide the first data value that is read out from NVFF 500 during a clock cycle.

Coming now to the write phase, of say, a second data value, control signal phi3 is driven high, which enables a third pass gate transistor PG3 to transfer the second data value from data input port "d" to the second combined terminal B1A2 of the master stage. The first combined terminal A1B2 is maintained at a write reference voltage of Vdd_div2, which represents a voltage which is approximately half the value of the positive supply voltage Vdd. The write reference voltage may be supplied through a write reference voltage port. In order to ensure that there is no confusion between the first data value being read out from the slave stage on output port "q" and the second data value being written into the master stage on input port "d," the control signals phi3 and phi2 are staggered. In some cases, phi3 may be an inverted value of phi2 or a slightly delayed and inverted value of phi2.

From the above description of NVFF 500, it is seen that an additional sense amplifier is not required in the master stage to sense the values stored in the GSHE-MTJs J1 and J2. Moreover, there is also no need for a voltage divider as is seen in conventional NVFF implementations, in NVFF 500.

With reference to FIG. 5B, an exemplary timing diagram is provided for the above-described operation of NVFF 500. The time duration between time instances t1 and t7 shown in FIG. 5B represents a single cycle or a clock period of a system clock (not shown). The system clock may be used to derive the control signals phi1, phi2, and phi3 in some aspects.

With combined reference to FIGS. 5A-B, the three-phase operation of NVFF 500 will be described with regard to the timeline of signals shown in FIG. 5B. A read operation will first be described. At time t1, the read operation is initiated by driving the first control signal phi1 high, which activates the equalization transistor EQ. In some aspects, phi1 may be driven to overdrive, i.e., voltages above positive supply voltage Vdd. Driving the control signals to overdrive in this manner can deliver higher voltage to ensure desired operation of the circuitry. Thus, starting at time t1, the inverters Inv1 and Inv2 enter the equalization or initialization phase, which resets or clears the output "q," in preparation for reading the value stored in the GSHE-MTJs J1 and J2. This type of equalization is also referred to as "strong-arm sense amplification," where EQ equalizes the two inverters at a same starting point at time t1.

At time t2, the second control signal phi2 is driven high (once again with the option of driving the signal overdrive voltages in some aspects). Although phi2 can be driven high once a pulse on phi1 goes low, in the timeline shown, phi2 can be driven to a high voltage at time t2, while phi1 is still high. This gets a head start on enabling the first and second pass gate transistors PG1 and PG2 to start reading the values stored in GSHE-MTJs J1 and J2 through read terminals C1 and C2 respectively.

Once phi1 goes low at time t3, phi2 continues to be high at time t4, at which point, the equalization transistor EQ is no longer active, and inverters Inv1 and Inv2 toggle to deliver complementary outputs at their respective output nodes. Owing to the low resistance states between GSHE-MTJs J1 and J2, the driving of the inverters Inv1 and Inv2 is made easier, avoiding the need for additional sense amplifiers. Thus, at time t4, the output q becomes valid. The output q is retained at valid, or said to be climbing a valid state until a write operation commences. The output "q" represents the first data value that is read out from NVFF 500 in the first clock cycle.

The write operation of the second data value begins with phi3 being driven high (also, maybe in some aspects to overdrive voltage) at time t6, after phi2 goes low at time t5. Care must be taken to ensure that phi3 being driven high does not overlap with phi2 being high (i.e., t6 is greater than or equal to t5). As previously mentioned, some embodiments may implement this by creating phi3 as an inverted or inverted and delayed version of phi2. The voltage Vdd_div2 is applied to terminal A1B2. The value of Vdd_div2, which is a write reference voltage, is made close to $V_{dd}/2$, and preferably, slightly above $V_{dd}/2$ but at least 0.2V below $V_{dd}$. In some aspects, the write reference voltage Vdd_div2 may also be connected to a fourth pass transistor PG4 (e.g., a p-channel MOS or PMOS). This fourth pass transistor PG4 and its connections thereof are optional, and hence they are represented with dotted lines in FIG. 5A. To record or write the second data value into the master stage comprising the dual GSHE-MTJs J1 and J2, phi3 is maintained high while holding a valid data signal for the second data value on data input port d, starting at time t6 and until time t7 (once again, ensuring that phi2 is maintained low during this write phase).

Based on the above description, it is seen that the first control signal phi1 may be applied as a first pulse (e.g., between time instances t1 and t3) for the equalization phase and the second control signal phi2 may be applied as a second pulse (e.g., between time instances t2 and t5, ensuring that phi2 is valid at least at time t4, after t3, when phi1 falls). The control signal phi3 may be maintained low during the times the first and second pulses are applied on phi1 and phi2. Using this combination of control signals, NVFF 500 may be constructed as a single stage NVFF, wherein a write operation may be performed while a read operation is in progress, within a single clock cycle. It is also noted that the above-noted operation of NVFF 500 involves a unipolar write, in the sense that a single "d" input is utilized for writing the second data value. In other words, there is no need for a complementary or inverse value of "d" to be generated and applied to the MTJ for switching (in contrast to conventional implementations which require true and complement values of "d" for the operation of conventional NVFFs). The unipolar write is achieved by the use of the write reference voltage Vdd_div2 applied to one of the combined terminals (e.g., B1A2, as shown), whereby, if the second data value is greater than the write reference voltage, then a logic "1" may be stored in the dual GSHE-MTJs J1 and J2 and if the second data value is less than the write reference voltage, then a logic "0" may be stored in the dual GSHE-MTJs J1 and J2.

Variations of the above structure of NVFF 500 will now be described. As previously mentioned, the fourth pass gate transistor PG4 may be a PMOS transistor, which may be optional. Transistor PG4 may be used to minimize read disturbances. Transistor PG4 may also be controlled by the third control signal phi3, such that, transistor PG4 may be enabled to conduct when phi3 is low. In other words, transistor PG4 may be turned on when phi3 is not active high, for example, during read operations. This causes the write reference voltage Vdd_div2 to be supplied to the second combined terminal as well. Thus, during a read operation, both the first and second combined terminals would be connected to the write reference voltage, which means that no new data value can be inadvertently written into the master stage, which minimizes read disturbances.

Transistor PG4 may not be required in NVFF 500 if the value of Vdd_div2/$R_{MTJ}$ is much smaller than $I_c$ (i.e., $I_c$, the switching critical current or switching threshold current used to flip the states of the MTJs J1 and J2, is high enough to avoid read disturbances). The voltage Vdd_div2 may be set to be higher than Vdd/2, but must be less than Vdd or preferably about 0.2V less than Vdd, for improved conductivity of transistor PG4.

Figure 6:
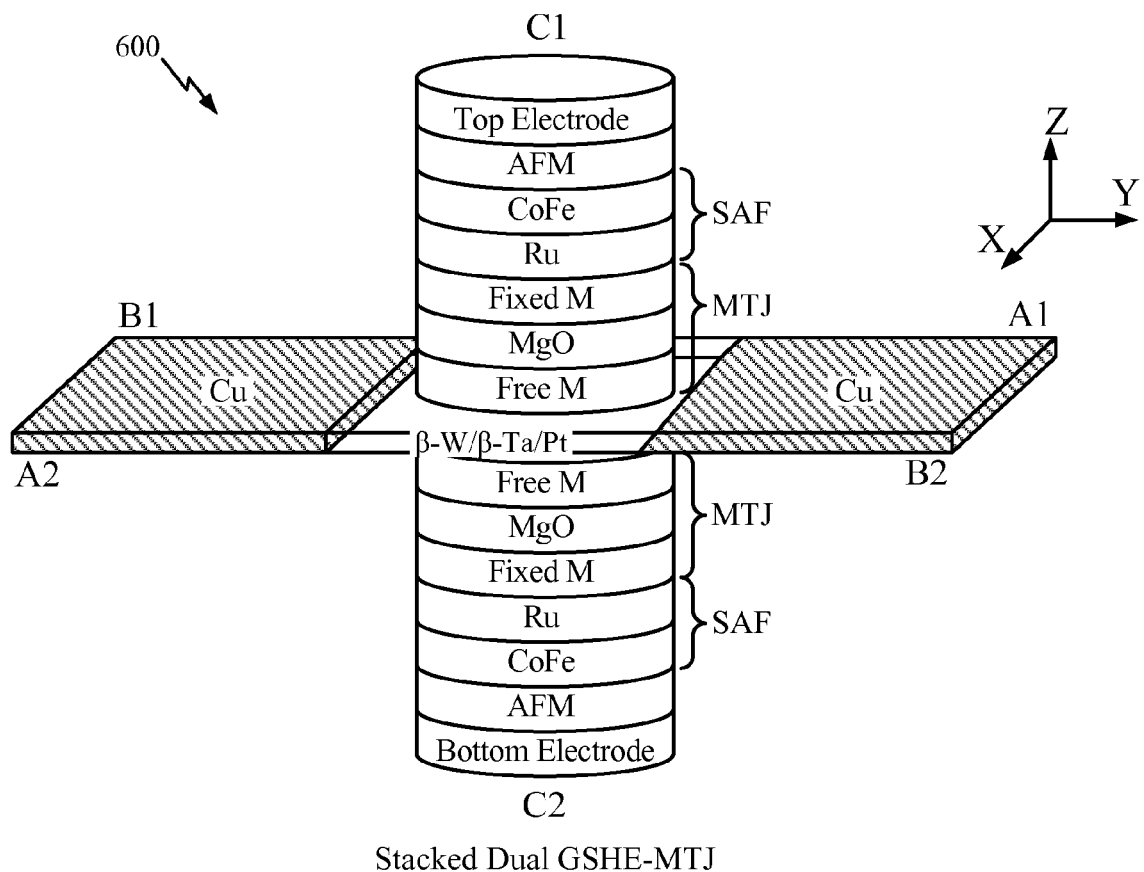
FIG. 6 illustrates a stacked implementation of a dual GSHE-MTJ storage structure of exemplary NVFFs.

With reference to FIG. 6, an embodiment for forming the dual GSHE-MTJs J1 and J2, the combination illustrated as "600," along with their described connection is illustrated. As shown, the two GSHE-MTJs J1 and J2 may be formed by stacking the MTJs J1 and J2 on either side of a GSHE strip formed in-between the two combined terminals A2B1 and A1B2. The stacked dual GSHE-MTJ structure 600 of FIG. 6 provides spin-orbital coupling of the GSHE strip sandwiched between the two free layers of the two MTJs J1 and J2, which allows sharing of the resulting spin-orbital coupling formed in the GSHE strip layer. The magnetization directions of the two fixed layers are the same. Other stacking structures for the exemplary GSHE-MTJs J1 and J2 are also possible within the scope of this disclosure.

Figures 7A, 7B:
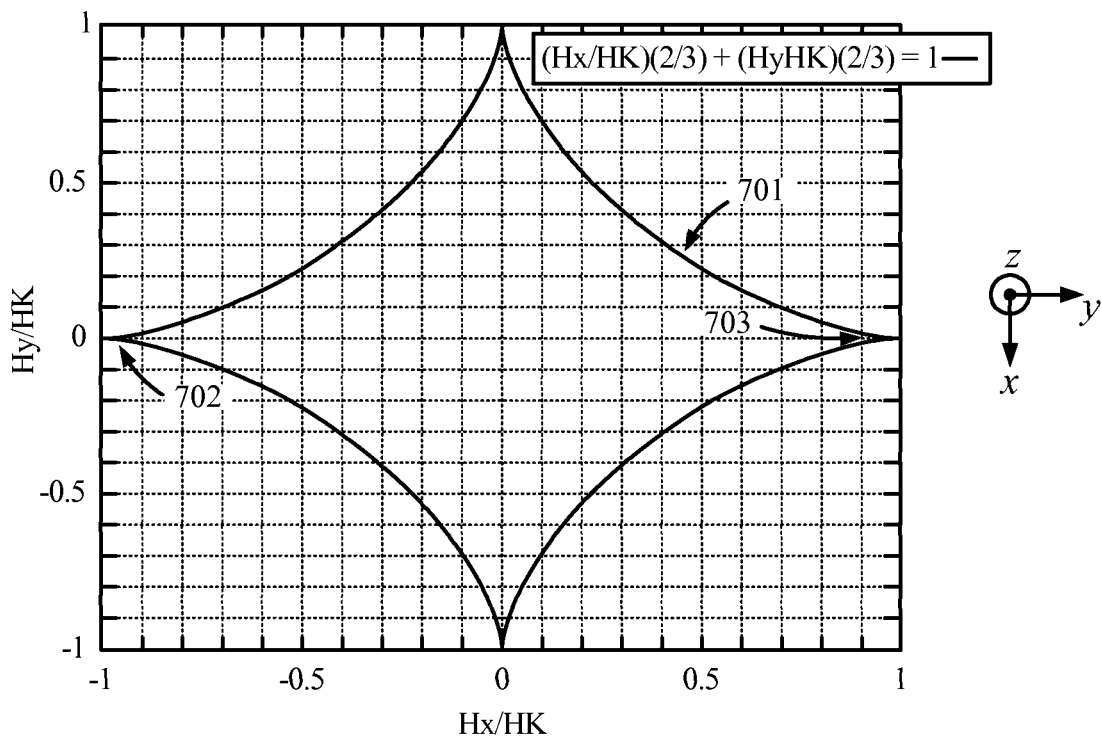
FIG. 7A illustrates the well-known Stoner-Wohlfarth astroid curve.
FIG. 7B illustrates well-known equations pertaining to the Stoner-Wohlfarth switching astroid of FIG. 7A.

Yet another embodiment will be described by first referring to FIG. 7A. In FIG. 7A, the well-known Stoner-Wohlfarth astroid is depicted. Briefly, the Stoner-Wohlfarth astroid or curve is a geometric representation of the Stoner-Wohlfarth model. As depicted, discontinuous changes of magnetization can occur when the curve is traversed. More specifically, tangents (i.e., x and y axes) to the astroid represent magnetization directions with extremal energy, i.e. either local minima or local maxima. For a system with a uniaxial anisotropy the tangent(s) that are closest to the easy axis lead to stable solutions, i.e. minimal energy. With relation to the GSHE direction, it is observed that if the magnetization direction of the GSHE strip is offset from the easy axis of the MTJ, the switching threshold current (which, in this case, is the lowest current that passes through terminal C, which can effect a switch in the resistance states of the MTJ, based on spin-transfer torque (STT) and full assistance of the giant spin Hall effect (GSHE)) is much smaller, as depicted by a crest such as "701" in FIG. 7A. If, on the other hand, the easy axis is aligned with the GSHE magnetization direction, then the switching threshold current (which, in this case, is lowest current that passes through terminal C to effect a switch in states in the MTJ, with spin-transfer torque (STT) and under partial or no assistance of giant spin Hall effect (GSHE)) would be higher, as depicted by extremal points 702/703 on the astroid. FIG. 7B provides well-known equations pertaining to the Stoner-Wohlfarth switching astroid of FIG. 7A.

In the following aspects, systems and methods for lowering the switching threshold current for GSHE-MTJs, by exploiting the Stoner-Wohlfarth switching astroid, will be discussed.

Figure 8A:
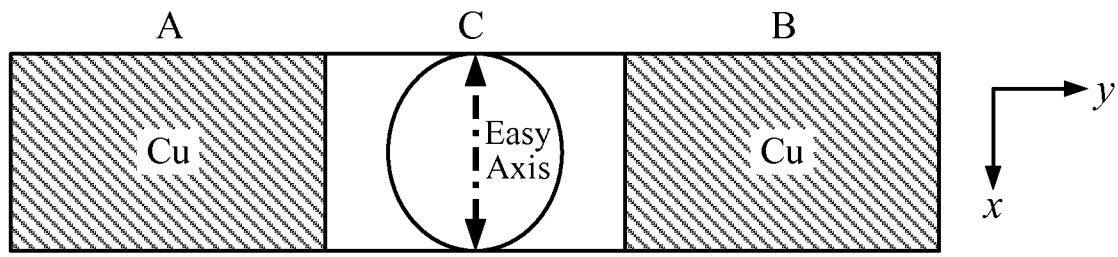
FIGS. 8A-B illustrate orientations of easy axes of MTJs of exemplary dual GSHE-MTJ storage elements with regard to switching current polarization direction of a common GSHE strip.

In FIG. 8A, a top view of a GSHE-MTJ memory element, such as, memory element 400 of FIGS. 4A-C (or one of the two GSHE-MTJs J1/J2 600 of FIG. 6) is shown. The easy axis is along the x-axis, which coincides with or is aligned with the spin-orbit magnetization direction of the GSHE strip between terminals A and B. The MTJ is formed in an oval or elliptical shape, and the easy axis coincides with the major axis or longer axis of the ellipse. As discussed with reference to the Stoner-Wohlfarth switching astroid in FIGS. 7A-B, this alignment of the easy axis and the GSHE magnetization direction does not provide the lowest switching threshold current. On the other hand, the lowest switching threshold current (e.g., corresponding to crest 701) is achieved when the easy axis and the GSHE magnetization direction are misaligned, and even more specifically, are neither parallel nor perpendicular. Accordingly, aspects for lowering switching threshold current based on a misaligned orientation of the easy axis and the GSHE magnetization direction, are shown in FIG. 8B.

Figure 8B:
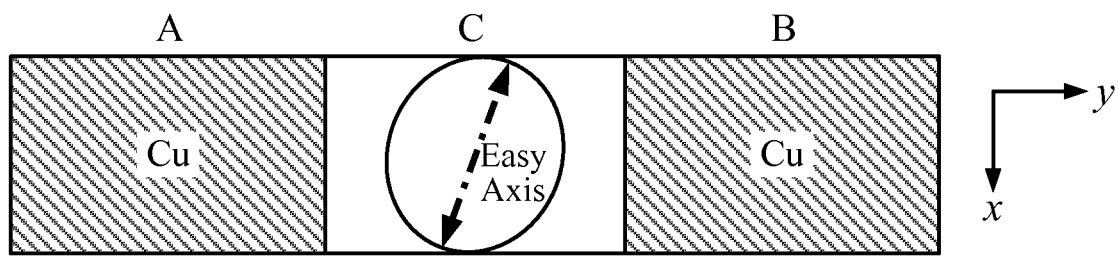

In FIG. 8B, the MTJ, which is formed of an elliptical shape with its easy axis aligned with the major axis of the ellipse, is fabricated in such a manner that the easy axis is oriented to be neither parallel nor perpendicular to the GSHE magnetization direction. For example, the MTJ is oriented with a 45 degree angle to the GSHE magnetization direction, which leads to the lowest switching current. In general, any angle between 0 and 90 degrees (i.e., any acute angle) can be used, keeping in mind that a 45 degree angle may provide the best results or lowest switching current. In this manner, the easy axis and the GSHE magnetization direction are misaligned to result in a very low switching threshold current. This low switching threshold current provides further ease of writing to the GSHE-MTJs J1 and J2 in FIG. 5A, for example. In FIG. 6, the stacked dual GSHE-MTJ structure 600 may be fabricated, for example, with both MTJs J1 and J2 tilted or aligned in similar manner. It may be possible to form the angles of tilting of J1 and J2 to be different from each other (while still being neither parallel nor perpendicular to the common GSHE polarization). Alternatively both the MTJs J1 and J2 may be fabricated such that their easy axes coincide.

Returning to FIG. 5A, it is observed that NVFF 500 is formed with merely nine transistors (NMOS and PMOS combined, or in other words, a total of nine MOSFETs) and two GSHE-MTJs. The two GSHE-MTJs J1 and J2 may be formed with their easy axes tilted or oriented with an acute angle to the GSHE polarization, as noted above, where this tilting can reduce the switching critical current of the MTJs with an aspect ratio which is less than 2 (the switching current improvement is also observed if the MTJ aspect ratio is greater than 2). The two GSHE-MTJs J1 and J2 may be additionally or alternatively stacked for sharing of spin-orbital coupling layer or common GSHE layer as noted above. Stacking reduces area and uses the switching power for one GSHE-MTJ to switch two GSHE-MTJs, and thus is very efficient.

Figure 9:
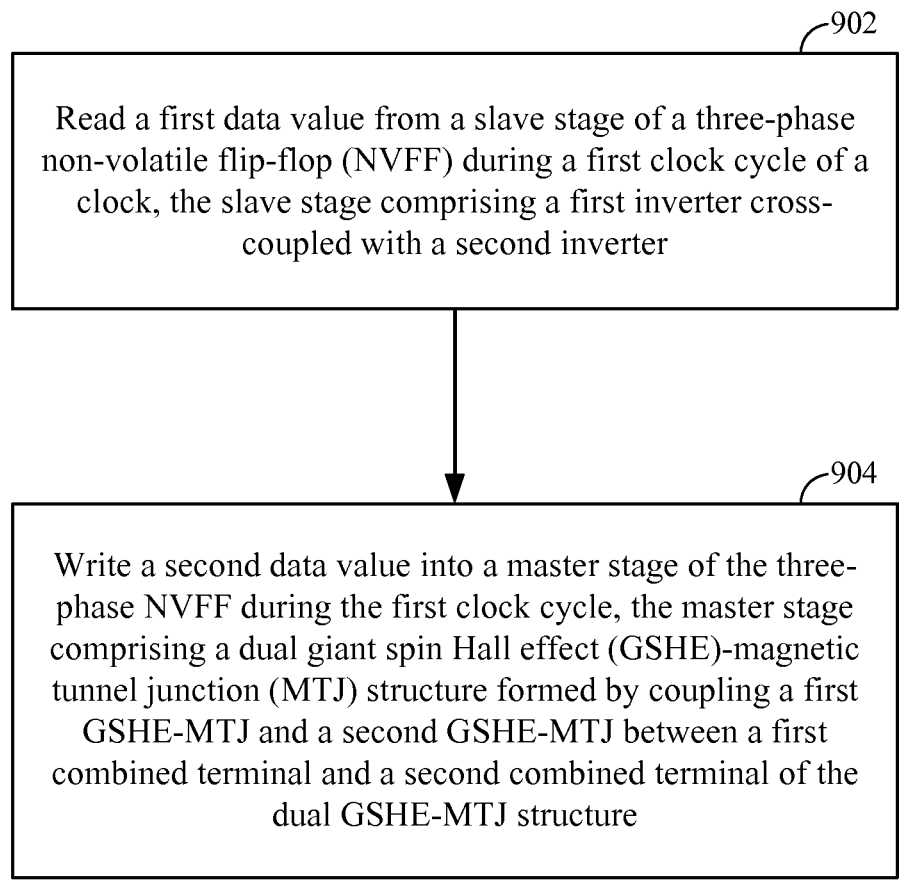
FIG. 9 illustrates a method of operating an exemplary three-phase NVFF according to aspects of this disclosure.

It will be appreciated that aspects include various methods for performing the processes, functions and/or algorithms disclosed herein. For example, as illustrated in FIG. 9, a method of operating a three-phase non-volatile flip-flop (NVFF) (e.g., NVFF 500) is shown. The method comprises reading a first data value (e.g., "q" in FIG. 5A) from a slave stage during a first clock cycle (e.g., between time t1-t7 in FIG. 5B) of a clock, the slave stage comprising a first inverter (e.g., Inv1 of FIG. 5A) cross-coupled with a second inverter (e.g., Inv2 of FIG. 5A)—Block 902; and writing a second data value (e.g., "d" in FIG. 5A) into a master stage during the first clock cycle, the master stage comprising a dual giant spin Hall effect (GSHE)-magnetic tunnel junction (MTJ) structure formed by coupling a first GSHE-MTJ (e.g., J1 in FIG. 5A) and a second GSHE-MTJ (e.g., J2 in FIG. 5B) between a first combined terminal and a second combined terminal of the dual GSHE-MTJ structure.

Accordingly, a description of exemplary embodiments related to exemplary NVFFs using GSHE-MTJs, and various embodiments directed to stacking of the GSHE-MTJs and tilting of the orientation of the MTJs for improved switching currents have been presented.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an exemplary embodiment can include a computer readable media embodying a method for forming exemplary compact low power three-phase GSHE-MTJ NVFFs. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A three-phase non-volatile flip-flop (NVFF) comprising:
a master stage comprising a dual giant spin Hall effect (GSHE)-magnetic tunnel junction (MTJ) structure, the dual GSHE-MTJ structure comprising a first GSHE-MTJ and a second GSHE-MTJ coupled between a first combined terminal and a second combined terminal;
a first pass gate transistor directly connected to a first read terminal of the first GSHE-MTJ and a second pass gate transistor directly connected to a second read terminal of the second GSHE-MTJ; and
a slave stage coupled to the master stage through the first pass gate transistor and the second pass gate transistor, the slave stage comprising a first inverter cross-coupled with a second inverter, wherein the slave stage is configured to be initialized during an initialization phase of a first clock cycle of a clock, based on a first control signal; and
wherein a first data value stored in the master stage is configured to be read out from the master stage and transferred to the slave stage based on a second control signal applied to a gate of the first pass gate transistor and a gate of the second pass gate transistor, and provided as an output of the three-phase NVFF, during a read phase of the first clock cycle; and
a second data value provided as an input to the three-phase NVFF is configured to be written to the master stage based on a third control signal during a write phase of the first clock cycle.

2. The three-phase NVFF of claim 1, wherein an input node of the first inverter is coupled to an input node of the second inverter through an equalization transistor.

3. The three-phase NVFF of claim 2, wherein the first control signal is configured to activate the equalization transistor during the initialization phase.

4. The three-phase NVFF of claim 1, wherein the first read terminal of the first GSHE-MTJ is coupled to an input node of the first inverter through the first pass gate transistor and the second read terminal of the second GSHE-MTJ is coupled to an output node of the first inverter through the second pass gate transistor.

5. The three-phase NVFF of claim 4, wherein the first data value is valid at an output node of the second inverter during the read phase.

6. The three-phase NVFF of claim 1, wherein the first combined terminal is coupled to a data input port through a third pass gate transistor, and the second combined terminal is coupled to a write reference voltage.

7. The three-phase NVFF of claim 6, wherein the third control signal is configured to activate the third pass gate transistor to write the second data value available on the data input port into the master stage, during the write phase.

8. The three-phase NVFF of claim 6, wherein the second combined terminal is coupled to the write reference voltage through a fourth pass gate transistor.

9. The three-phase NVFF of claim 8, wherein the fourth pass gate transistor is activated when the third control signal is low, such that during a read operation, the write reference voltage is applied to the first and second combined terminals in order to minimize read disturbances on the master stage.

10. The three-phase NVFF of claim 1, wherein the first control signal and the second control signal are applied as a first pulse and a second pulse, respectively.

11. The three-phase NVFF of claim 10, wherein the second pulse is delayed from the first pulse.

12. The three-phase NVFF of claim 1, wherein the third control signal is an inverted value of the second control signal.

13. The three-phase NVFF of claim 1, wherein the first, second, and third control signals are derived from the clock.

14. The three-phase NVFF of claim 1, wherein at least one of the first, second, or third control signals is driven to an overdrive voltage which is greater than a positive supply voltage.

15. The three-phase NVFF of claim 1, wherein the first combined terminal comprises a first terminal of the first GSHE-MTJ and a second terminal of the second GSHE-MTJ, and the second combined terminal comprises a second terminal of the first GSHE-MTJ and a first terminal of the second GSHE-MTJ.

16. The three-phase NVFF of claim 1 wherein easy axes of the first and second GSHE-MTJs are oriented to be tilted at an acute angle with reference to a GSHE polarization.

17. The three-phase NVFF of claim 16, wherein the acute angle is 45 degrees.

18. The three-phase NVFF of claim 1, wherein the first and second GSHE-MTJs are fabricated to be stacked on first and second sides of a GSHE strip formed between the first and second combined terminals.

19. A method of operating a three-phase non-volatile flip-flop (NVFF), the method comprising:
initializing a slave stage based on a first control signal during an initialization phase of a first clock cycle of a clock, the slave stage comprising a first inverter cross-coupled with a second inverter; wherein the slave stage is coupled to a master stage through a first pass gate transistor and a second pass gate transistor,
the master stage comprising a dual giant spin Hall effect (GSHE)-magnetic tunnel junction (MTJ) structure formed by coupling a first GSHE-MTJ and a second GSHE-MTJ between a first combined terminal and a second combined terminal of the dual GSHE-MTJ structure, with the first pass gate transistor directly connected to a first read terminal of the first GSHE-MTJ and a second pass gate transistor directly connected to a second read terminal of the second GSHE-MTJ;
transferring a first data value stored in the master stage to the slave stage based on a second control signal applied to a gate of the first pass gate transistor and a gate of the second pass gate transistor and providing the first data value as an output of the three-phase NVFF during a read phase of the first clock cycle; and writing a second data value provided as an input to the three-phase NVFF to the master stage based on a third control signal during a write phase of the first clock.

20. The method of claim 19, comprising coupling an input node of the first inverter to an input node of the second inverter during the initialization phase.

21. The method of claim 19, comprising transferring the first data value from the first and second read terminals of the first and second GSHE-MTJs, respectively, to an output node of the second inverter during the read phase.

22. The method of claim 19 further comprising coupling a write reference voltage to the second combined terminal during the write phase.

23. The method of claim 22, further comprising coupling the write reference voltage to the first combined terminal during the read phase, to minimize read disturbances on the master stage.

24. The method of claim 19, comprising orienting or tilting easy axes of the first and second GSHE-MTJs at an acute angle with reference to a GSHE polarization.

25. The method of claim 19, comprising forming the dual GSHE-MTJ structure by stacking the first and second GSHE-MTJs on first and second sides of a GSHE strip formed between the first and second combined terminals.

26. A system comprising:

a three-phase non-volatile flip-flop (NVFF) with a master stage and a slave stage, the master stage comprising a dual giant spin Hall effect (GSHE)-magnetic tunnel junction (MTJ) structure formed by coupling a first GSHE-MTJ and a second GSHE-MTJ between a first combined terminal and a second combined terminal of the dual GSHE-MTJ structure, and the slave stage comprising a first inverter cross-coupled with a second inverter;

means for initializing the slave stage based on a first control signal during an initialization phase of a first clock cycle of a clock;

means for transferring a first data value stored in the master stage to the slave stage based on a second control signal, the means for transferring being directly connected to a first read terminal of the first GSHE-MTJ and a second read terminal of the second GHSE-MTJ, and means for providing the first data value as an output of the three-phase NVFF, during a read phase of the first clock cycle; and means for writing a second data value provided as an input to the three-phase NVFF to the master stage based on a third control signal, during a write phase of the first clock cycle.

\* \* \* \* \*